United States Patent
Gaidis et al.

(10) Patent No.: US 7,635,884 B2
(45) Date of Patent: Dec. 22, 2009

(54) METHOD AND STRUCTURE FOR FORMING SLOT VIA BITLINE FOR MRAM DEVICES

(75) Inventors: Michael C. Gaidis, Wappingers Falls, NY (US); Carl Radens, LaGrangeville, NY (US); Lawrence A. Clevenger, LaGrangeville, NY (US); Timothy J. Dalton, Ridgefield, CT (US); Louis L. C. Hsu, Fishkill, NY (US); Keith Kwong Hon Wong, Wappingers Falls, NY (US); Chih-Chao Yang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 140 days.

(21) Appl. No.: 11/193,660

(22) Filed: Jul. 29, 2005

(65) Prior Publication Data
US 2007/0023806 A1 Feb. 1, 2007

(51) Int. Cl.
*H01L 29/94* (2006.01)
(52) U.S. Cl. ..................................... 257/295
(58) Field of Classification Search ................ 257/295, 257/E21.663–E21.665, E43.001–E43.007, 257/E27.005–E27.006, E27.008, E27.167, 257/E29.272, E29.323, E27.102, E27.679, 257/E21.164, E27.103, E27.084, E27.096, 257/296, 300, 312, 314, 326, E27.078, E29.3–E29.309, 257/E21.436
See application file for complete search history.

(56) References Cited

U.S. PATENT DOCUMENTS

| | | | | |
|---|---|---|---|---|
| 6,225,211 | B1 | 5/2001 | Tsui | 438/624 |
| 6,444,573 | B1 | 9/2002 | Wang et al. | 438/638 |
| 6,603,206 | B2 | 8/2003 | Wang et al. | 257/774 |
| 6,649,531 | B2 | 11/2003 | Cote et al. | 438/714 |
| 6,784,510 | B1 | 8/2004 | Grynkewich et al. | |
| 6,806,096 | B1 | 10/2004 | Kim et al. | |
| 6,815,783 | B2 * | 11/2004 | Kim et al. | 257/421 |
| 6,927,467 | B2 * | 8/2005 | Kim | 257/421 |
| 2004/0152227 | A1 * | 8/2004 | Yoda et al. | 438/48 |
| 2005/0023581 | A1 | 2/2005 | Nuetzel et al. | |
| 2006/0054947 | A1 * | 3/2006 | Asao et al. | 257/295 |

OTHER PUBLICATIONS

R. F. Schnabel et al.; "Slotted Vias for Dual Damascene Interconnects in 1Gb DRAMs;" 1999 Symposium on VLSI Technology Digest of Technical Papers; 1999; pp. 43-44.
PCT Search Report for PCT/US06/28718 mailed Sep. 27, 2007.
Extended PCT Search Report Application No. 06788341.3—2203 / 1911096 PCT /US2006028718 Mailed Sep. 23, 2008.

* cited by examiner

*Primary Examiner*—Dao H Nguyen
*Assistant Examiner*—Tram H Nguyen
(74) *Attorney, Agent, or Firm*—Cantor Colburn LLP; Lou Percello

(57) ABSTRACT

A magnetic random access memory (MRAM) device includes a magnetic tunnel junction (MTJ) stack formed over a lower wiring level, a hardmask formed on the MTJ stack, and an upper wiring level formed over the hardmask. The upper wiring level includes a slot via bitline formed therein, the slot via bitline in contact with the hardmask and in contact with an etch stop layer partially surrounding sidewalls of the hardmask.

8 Claims, 10 Drawing Sheets

METHOD AND STRUCTURE FOR FORMING SLOT VIA BITLINE FOR MRAM DEVICES

BACKGROUND

The present invention relates generally to magnetic random access memory (MRAM) devices, and, more particularly, to a method and structure for forming slot via bitlines for MRAM devices.

Magnetic (or magneto-resistive) random access memory (MRAM) is a non-volatile random access memory technology that could replace the dynamic random access memory (DRAM) as the standard memory for computing devices. The use of MRAM as a non-volatile RAM would allow for "instant on" systems that come to life as soon as the system is turned on, thus saving the amount of time needed for a conventional PC, for example, to transfer boot data from a hard disk drive to volatile DRAM during system power up.

A magnetic memory element (also referred to as a tunneling magneto-resistive, or TMR device) includes a structure having ferromagnetic layers separated by an insulating nonmagnetic layer (barrier), and arranged into a magnetic tunnel junction (MTJ). Digital information is stored and represented in the memory element as directions of magnetization vectors in the magnetic layers. More specifically, the magnetic moment of one magnetic layer (also referred to as a reference layer) is usually maintained in a preassigned direction, while the magnetic moment of the magnetic layer on the other side of the tunnel barrier (also referred to as a "free" layer) may be switched during operation between the same direction and the opposite direction with respect to the fixed magnetization direction of the reference layer. The orientations of the magnetic moment of the free layer adjacent to the tunnel junction are also known as "parallel" and "antiparallel" states, wherein a parallel state refers to the same magnetic alignment of the free and reference layers, while an antiparallel state refers to opposing magnetic alignments therebetween.

Depending upon the magnetic state of the free layer (parallel or antiparallel), the magnetic memory element exhibits two different resistance values in response to a voltage applied across the tunnel junction barrier. The particular resistance of the TMR device thus reflects the magnetization state of the free layer, wherein resistance is typically "low" when the magnetization is parallel, and "high" when the magnetization is antiparallel. Accordingly, a detection of changes in resistance allows a MRAM device to provide information stored in the magnetic memory element (i.e., a read operation). There are different methods for writing a MRAM cell; for example, a Stoner-Wohlfarth astroid MRAM cell is written to through the application of fields to exceed a critical curve or stability threshold, in order to magnetically align the free layer in a parallel or antiparallel state. The free layer is fabricated to have a preferred axis for the direction of magnetization called the "easy axis" (EA), and is typically set by a combination of intrinsic anisotropy, strain induced anisotropy, and shape anisotropy of the MTJ.

A practical MRAM device may have, for example, a cross point cell (XPC) configuration, in which each cell is located at the crossing point between parallel conductive wordlines in one horizontal plane and perpendicularly running bit lines in another horizontal plane. This particular configuration is advantageous in that the layout of the cells helps to increase the array cell density of the device. However, one difficulty associated with the practical operation of a cross-point MRAM array relates to the sensing of a particular cell, given that each cell in the array is coupled to the other cells through several parallel leakage paths. The resistance seen at one cross point equals the resistance of the memory cell at that cross point in parallel with resistances of memory cells in the other rows and columns, and thus can be difficult to accurately measure.

Accordingly, MRAM devices are also fabricated with a field effect transistor (FET) based configuration. In the FET-based configuration, each MRAM cell includes an access transistor associated therewith, in addition to an MTJ. By keeping the access transistors to cells not being read in a non-conductive state, parasitic device current is prevented from flowing through those other cells. The tradeoff with the FET-based configuration versus the XPC-based configuration is the area penalty associated with the location of the access transistors and additional metallization lines. In a conventionally formed FET-based MRAM device, the MTJ is typically formed over a conductive metal strap that laterally connects the bottom of the MTJ to the access FET (through a via, metallization line and contact area stud). A metal hardmask layer or via is then formed on the top of the MTJ that, in turn, is coupled to an upper metallization line.

Because of the continuing trend of decreasing device ground rules and smaller wiring sizes, the scaling of MRAM devices becomes extremely difficult due to the current-carrying restrictions on very narrow wires used for switching the state of the MRAM cells. Ferromagnetic liners around the switching wires have been used to focus the switching fields on the MTJs, however they are expected to be less effective as wire sizes shrink. The scaling to lower operating voltages makes the problem even worse, as even lower resistance wires are needed to pass the same amount of current. Accordingly, it would be beneficial to devise a process that utilizes conductors of lower resistance to pass larger currents for switching MRAM devices, and to devise a process that further locates the centroid of the switching current closer to the MTJ so as to generate larger switching fields at the MTJ for a given switching current.

SUMMARY

The foregoing discussed drawbacks and deficiencies of the prior art are overcome or alleviated by a magnetic random access memory (MRAM) device, including a magnetic tunnel junction (MTJ) stack formed over a lower wiring level, a hardmask formed on the MTJ stack, and an upper wiring level formed over the hardmask. The upper wiring level includes a slot via bitline formed therein, the slot via bitline in contact with the hardmask and in contact with an etch stop layer partially surrounding sidewalls of the hardmask.

In another embodiment, a method for forming a magnetic random access memory (MRAM) device includes forming a magnetic tunnel junction (MTJ) stack over a lower wiring level, forming a hardmask on the MTJ stack, and forming an upper wiring level over the hardmask, the upper wiring level including a slot via bitline formed therein. The slot via bitline is in contact with the hardmask and with an etch stop layer at least partially surrounding sidewalls of the hardmask.

In still another embodiment, a method for forming a magnetic random access memory (MRAM) device includes forming, in an array portion of the device, a strap via over a first conductor in a lower wiring level. In a peripheral portion of the device, a conductive landing area is formed over a second conductor in the lower wiring level. A metal strap is formed over the strap via, and a patterned magnetic tunnel junction (MTJ) stack is formed over the metal strap, the MTJ stack having a patterned hardmask formed thereupon. An etch stop layer is formed upon the conductive landing area, the strap layer, and the hardmask.

In addition, a first dielectric layer is formed on the etch stop layer, exposing a first portion of the etch stop layer, and the first portion of the etch stop layer is selectively etched so as to expose the hardmask. A second dielectric layer is formed upon the first dielectric layer and the hardmask. A slot via bitline opening is patterned and etched over the hardmask, and a logic via opening is patterned and etched over the conductive landing area, the slot via bitline opening and logic via opening being formed within the first and second dielectric layers. The logic via opening is extended to etch through a second portion of the etch stop layer so as to expose the conductive landing area. An upper level logic wiring trench is patterned over the logic via while masking the slot via bitline opening, and the slot via bitline, the logic via and the upper level logic wiring trench is filled with conductive metal.

BRIEF DESCRIPTION OF THE DRAWINGS

Referring to the exemplary drawings wherein like elements are numbered alike in the several Figures.

DETAILED DESCRIPTION

Disclosed herein a method and structure for providing a practical means of implementing MRAM structures with larger current-carrying capacity in bitlines, and in a manner that eliminates the need for doing so through an additional mask level with respect to conventional devices. Although the structure and processes disclosed herein are presented in the context of an FET-based device, it is also contemplated that the principal features of the present disclosure are also applicable to other structures, including (but not limited to) a cross-point MRAM device, for example.

Briefly stated, a slot via bitline structure is created in lieu of a conventional bitline and hardmask via structure, wherein the conventional hardmask via structure is used to connect the hardmask layer atop the magnetic stack to the upper bitline. This may be accomplished, for example, by creating an etch stop layer above the MTJ and lateral strap that connects the bottom of the MTJ stack to a lower wiring level. Thus, the functionality of the hardmask via may be implemented as a slot (or trench) instead of a very small via. Moreover, by integrating these slots onto the same mask as the remaining conventional via features (e.g., for logic wiring) present between the particular upper and lower wiring levels, the need for an extra mask and patterning of the conventional hardmask via features is eliminated.

Figure 1:
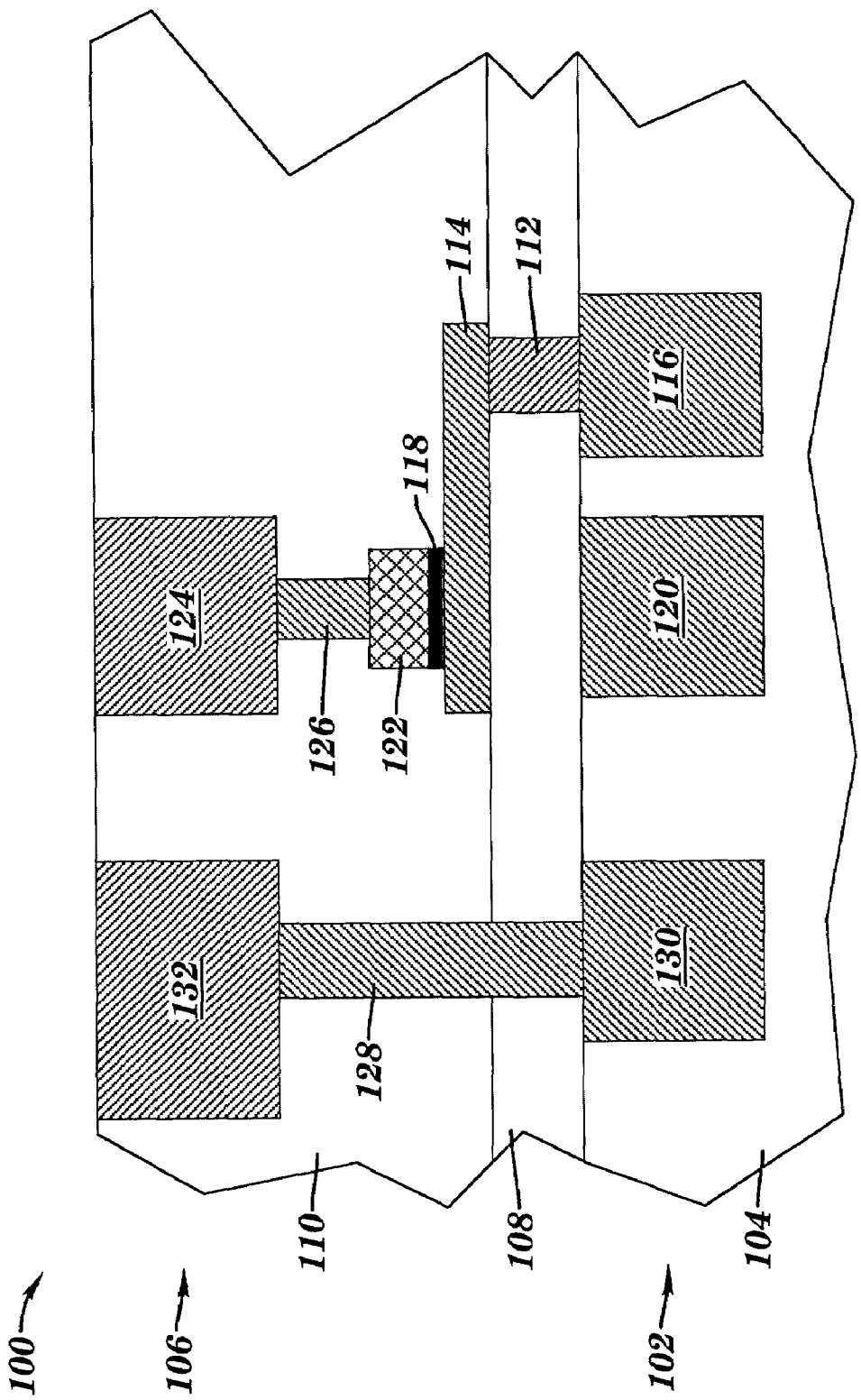
FIG. 1 is a cross sectional view of a conventional FET-based MRAM device.

Referring initially to FIG. 1, there is shown a cross sectional view of a portion of a conventional FET-based MRAM device 100. In particular, the device 100 as depicted in FIG. 1 includes a lower wiring level 102, formed in a lower layer of interlevel dielectric (ILD) material 104 (e.g., TEOS, SiCOH), and an upper wiring level 106. As a result of the FET-based architecture, two individual interlevel dielectric layers 108, 110 (e.g., SiN, SiCN, TEOS, SiCOH) are formed over the lower wiring level 102. ILD layer 108 is first formed in order facilitate the definition of a strap via 112, which connects a conductive metal strap 114 to a conductor 116 in the lower wiring level 102. As indicated above, conductor 116 in turn couples the MRAM cell to an access transistor formed in an active area of the underlying semiconductor wafer (not shown).

Disposed at the other end and atop the metal strap is the MTJ stack 118 of the device 100. As is shown, the MTJ stack is aligned directly above conductor 120 in the lower wiring level 102, wherein the conductor 120 is used in conjunction with conductor 124 to write data to the MRAM cell. In the example depicted, the metal strap 114 is formed in ILD layer 110; however, the strap 114 could alternatively be formed in ILD layer 108 along with the strap via 112 as part of a dual damascene process. In any case, a conductive hardmask 122 is formed atop the MTJ stack 118 to provide sufficient protection to stack 118 during formation of the via 126, which serves to connect the stack/hardmask to the upper wiring layer 106.

In order to connect the top of the hardmask 122 to the corresponding bitline 124 of the device 100, a hardmask via 126 is formed within ILD layer 110. For purposes of illustration, the wiring in the upper level 106 (e.g., bitline 124) is shown rotated 90 degrees, as upper and lower wiring lines of an MRAM device are generally orthogonal to one another. In addition, for purposes of comparison, a logic via 128 is also shown formed through both ILD layers 108 and 110 to connect a logic-wiring conductor 130 in the lower level 102 with another conductor 132 in the upper wiring level 106. Such logic circuitry is commonly found in the memory array periphery, and is used to drive the memory elements or to perform other logic functions which may make use of the embedded MRAM device elements.

In the formation of the FET-based MRAM device 100, a separate mask and etch or electroless plateup is typically used to create the hardmask via 126, with very tight requirements on the overlay tolerance between the hardmask via 126 and the hardmask 124. The upper level bitline 124 is a relatively far distance from the magnetics within the MTJ stack 118, thus implying only a small switching field will be generated for a given write current through the bitline 124. With respect to the hardmask via 126, the logic via 128 is formed using a separate mask, for example in dual damascene fashion with the upper-level wiring trenches.

Because the formation of the hardmask via 126 utilizes an additional masking level and is not self-aligned, there is an expense associated with longer/more complex processing routes, and well as a reduced device yield. Unfortunately, existing processing schemes for defining MTJ devices with small dimensions favor the use of thinner hard masks; thus, there has been a continuing need for an interlevel via definition in order to contact the top of the hardmask 122 to the upper bitline 124. To this point, then, the existing approaches have incorporated schemes for creating the hardmask vias using an extra photomask level with critical overlay tolerances, complicated electroplating schemes, and/or complicated single, dual, or triple Damascene process flows.

Figure 2:
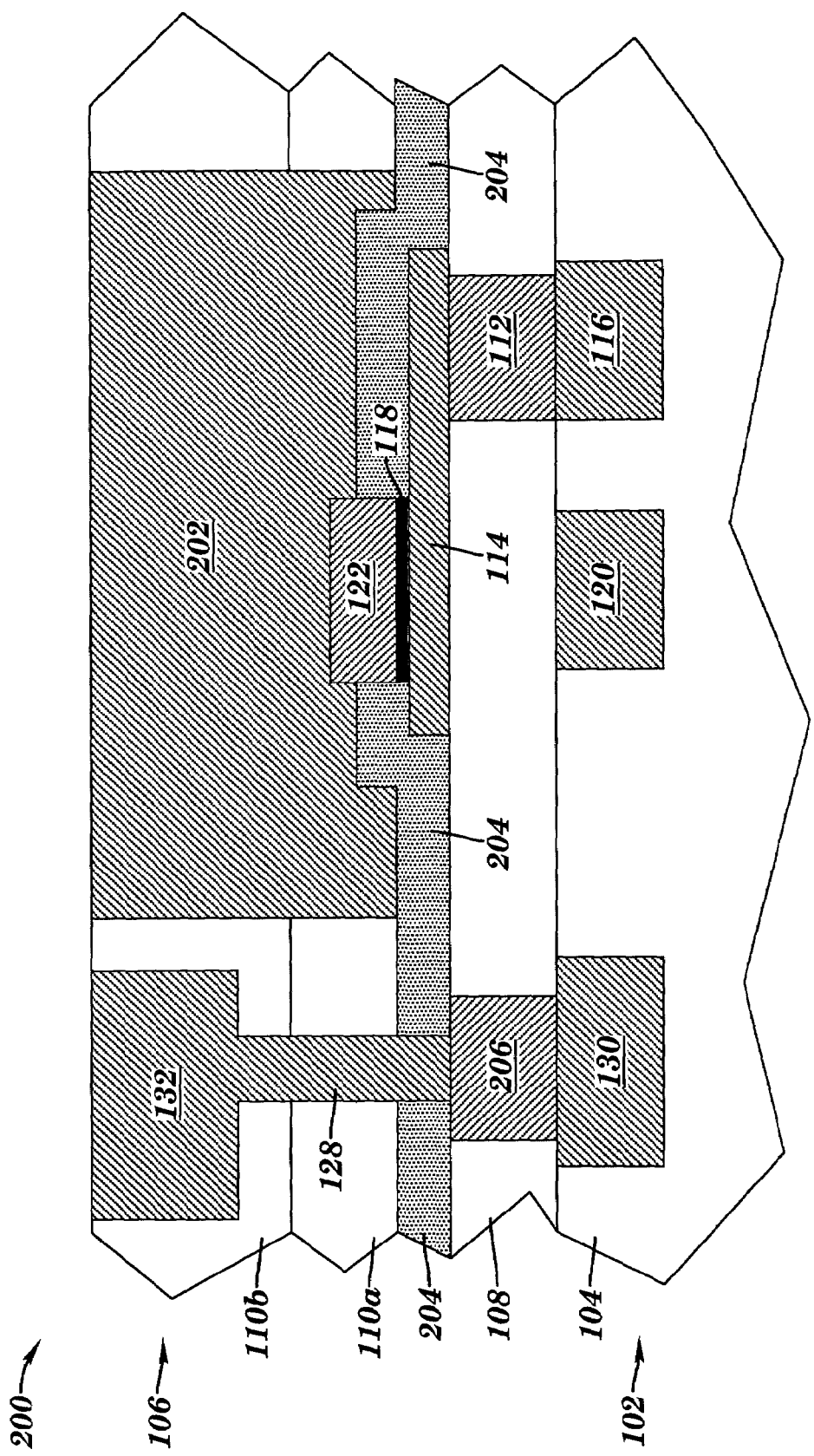
FIG. 2 is a cross sectional view of an MRAM device having slot via bitlines, in accordance with an embodiment of the invention.

Therefore, in accordance with an embodiment of the invention, FIG. 2 is a cross sectional view of an MRAM device 200 having a slot via bitline 202 coupled to the stack hardmask 122, and formed in a manner that combines hardmask via processing with another pre-existing metal level to provide simple and reliable contact to the MTJ 118. This is realized, in one embodiment, through the utilization of an etch stop layer 204 formed after hardmask/MTJ stack etching, followed by the slot bit line etching at the same time as the logic via formation in ILD layer 110. As will also be noted from FIG. 2 (and as will become more apparent hereinafter), the logic via 128 (instead of extending all the way from lower level conductor 130 to upper level conductor 132) is formed on a conductive landing area 206 defined on lower level conductor 130 at the same time the strap via 112 is formed. An exemplary process flow for forming the MRAM device 200 of FIG. 2 is shown in FIGS. 3 through 7.

Figure 3:
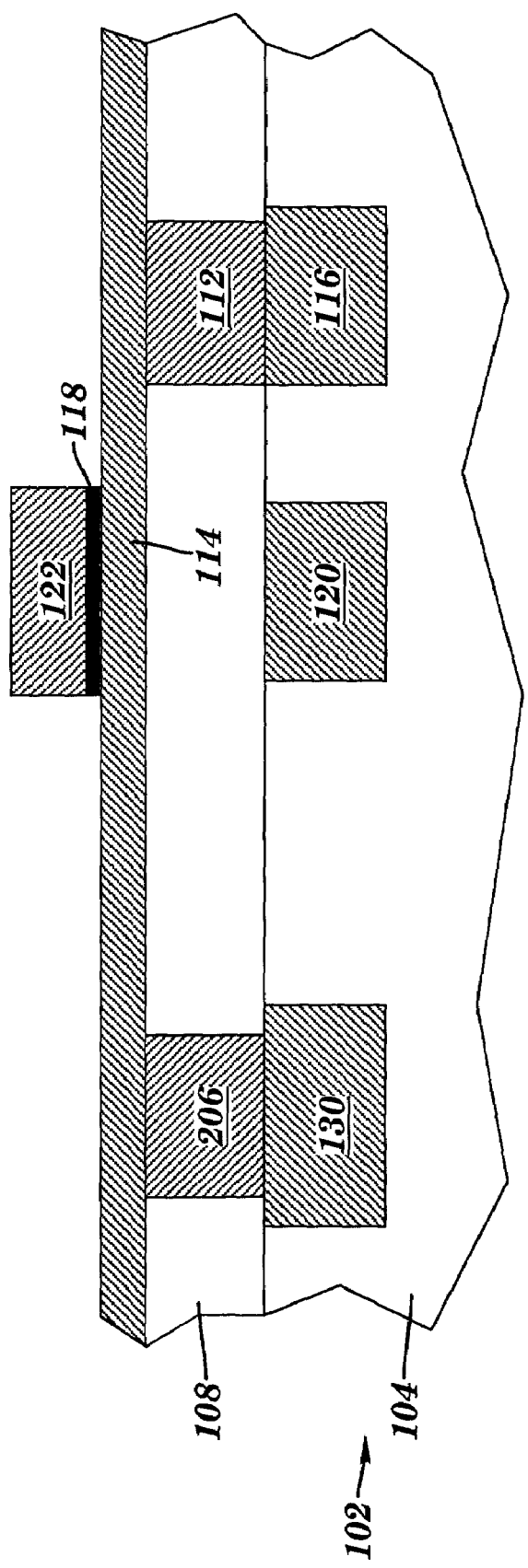
FIGS. 3 through 8 illustrate an exemplary process flow for forming the MRAM device of FIG. 2.

Beginning in FIG. 3, first ILD layer 108 is deposited over the lower metal wiring level 102, followed by the formation of the strap via 112 through single damascene processing (i.e., ILD patterning, etching, liner/metal deposition, CMP, etc.). In contrast to the conventional device 100 of FIG. 1, landing areas 206 are also patterned and formed in the ILD layer 108 concurrently with the strap via 112, and correspond to locations where logic via(s) will be formed during subsequent steps. Then, the metal for the strap 114 is formed over ILD layer 108, followed by the magnetic stack 118 material, followed by the hardmask 122 material. The hardmask layer 122 may be on the order of about 200 angstroms (Å) to about 2000 Å in thickness, for example. Both the hardmask layer 112 and MTJ stack 118 are then patterned and etched, stopping on the strap metal layer 114.

Figure 4:
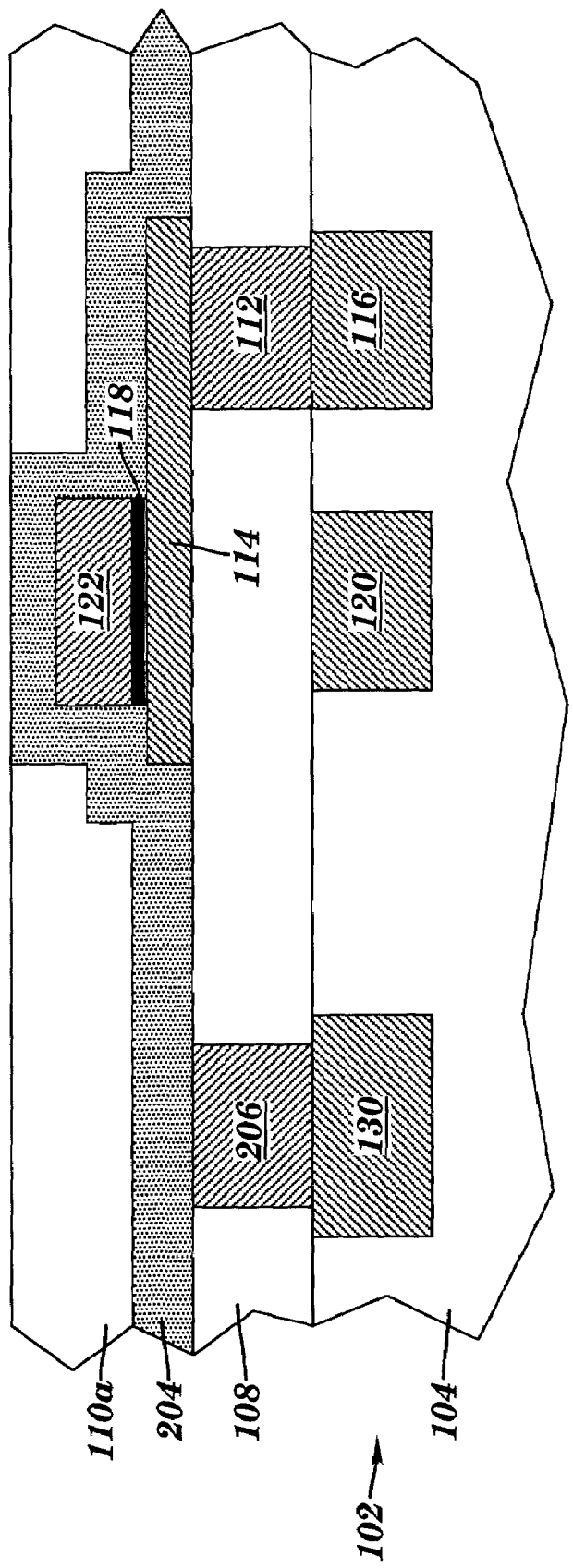

Proceeding to FIG. 4, the strap metal layer is patterned to form the lateral strap 114, followed by the formation of a thin etch stop layer 204 (e.g., 500 Å of SiN) and a dielectric fill material 110a (e.g., TEOS). The dielectric material 110a is chosen such that the etch stop layer 204 may be selectively etched with respect to the dielectric material 110a. In the event that the specific dielectric material 110a is not self-planarizing so as to leave the uppermost portions of the etch stop layer 204 (directly above the hardmask 122) exposed, then a chemical mechanical polishing (CMP) step may be performed to expose the top of the etch stop layer 204. As indicated above, it is also contemplated that the strap 114 can alternatively be formed in a damascene fashion as opposed to the etch-based patterning depicted in the Figures.

Figure 5:
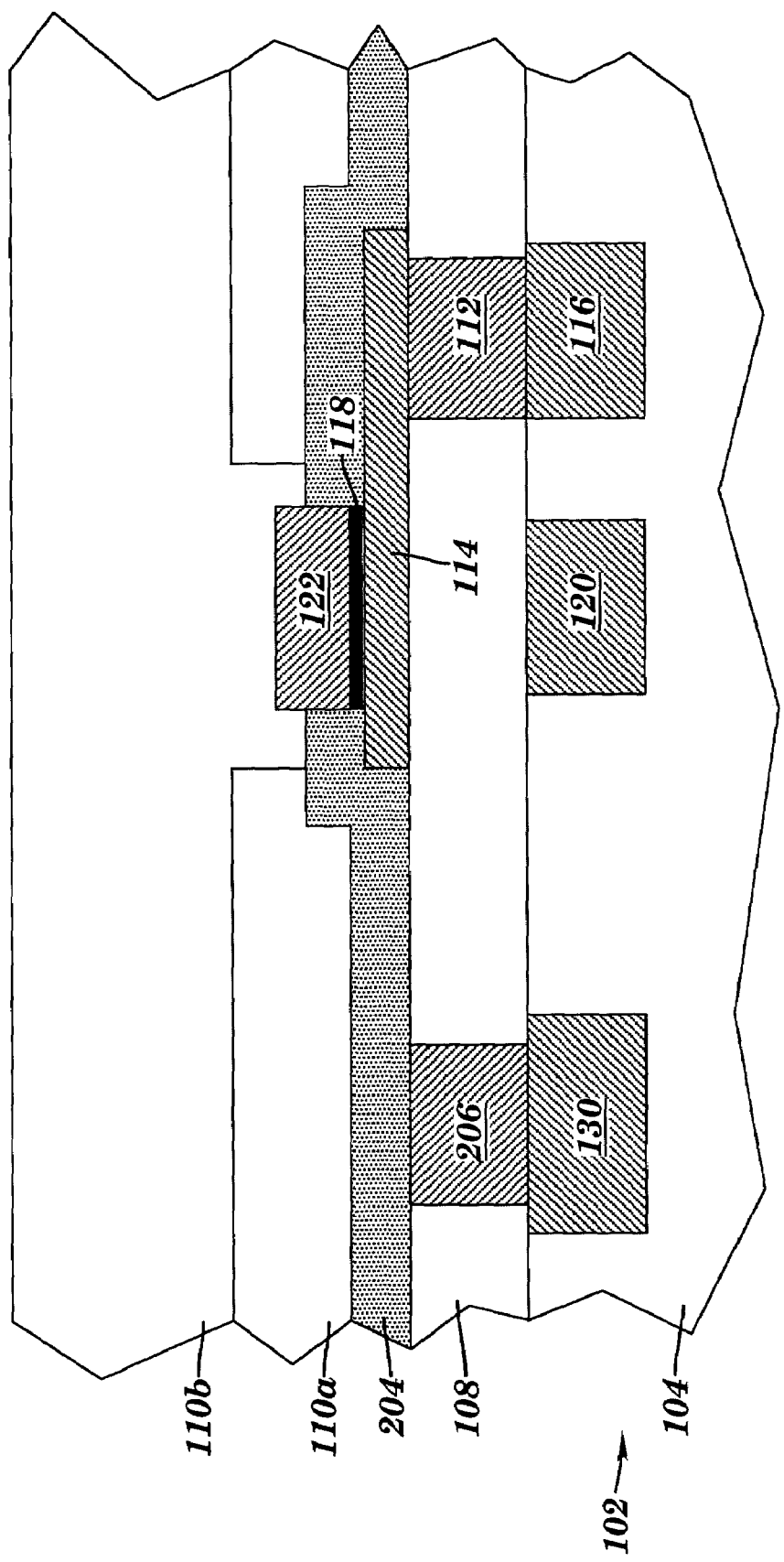

Upon exposing the top surface of the etch stop layer 204, a selective etch is used to open the etch stop layer 204 above the hardmask 122 without significant etching of ILD layer 110a, as shown in FIG. 5. This is followed by another dielectric deposition of layer 110b to complete the ILD definition for this level. It will be appreciated that the CMP step described with reference to FIG. 4 (if used) may be tuned to open the etch stop layer 204 atop metal hardmask 122, such that a selective etch is no longer necessary. However, a selective etch does provide an extra process window for the polishing operation, and has the added benefit of preventing hardmask delamination during the CMP step. Depending on the amount of topography in the upper surface of layer 110b, a CMP step may be used after its deposition to planarize it sufficiently for ensuing lithography.

Figure 6:
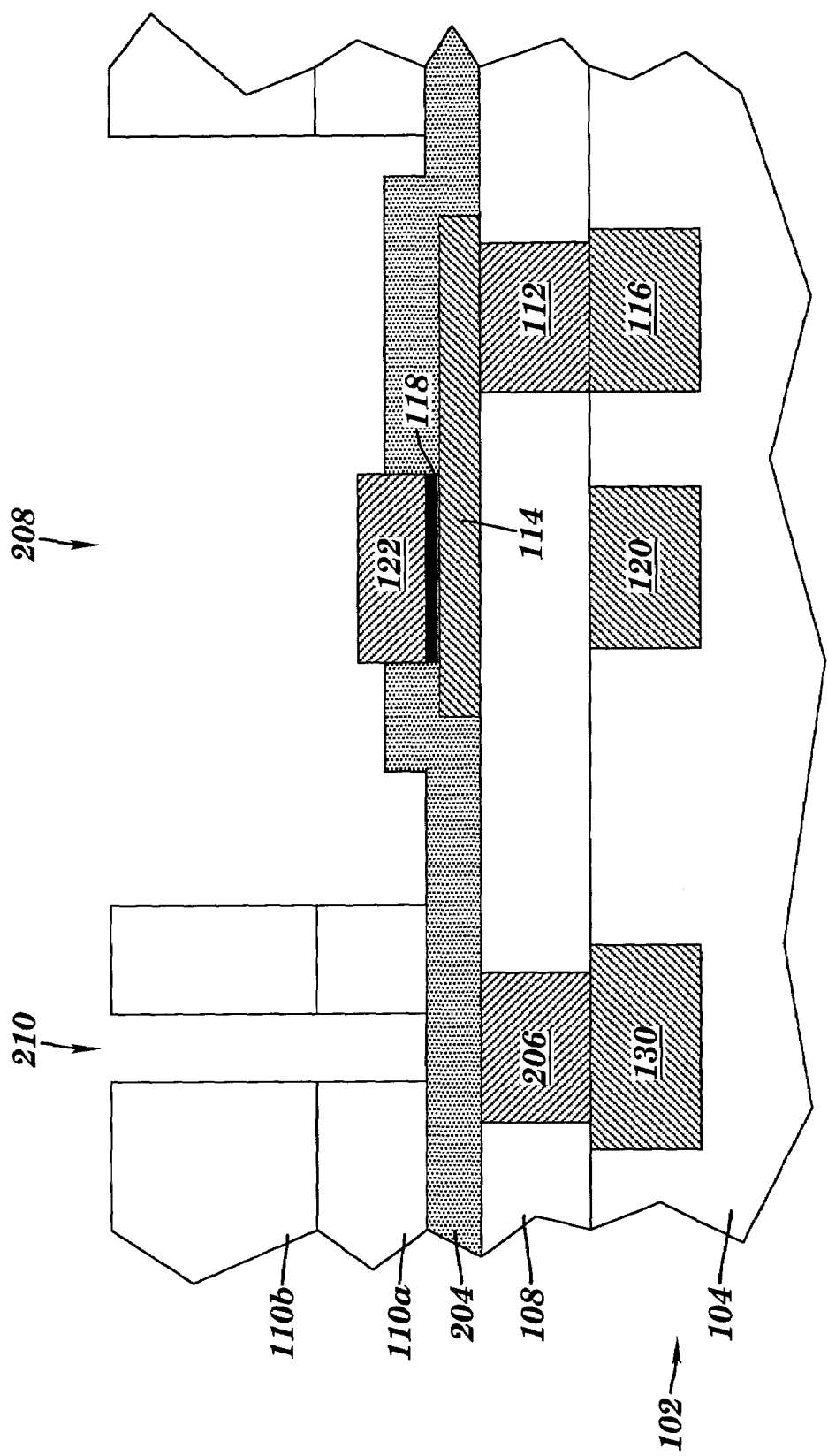

FIG. 6 illustrates the lithographic patterning and formation of both the slot bitline opening 208 and the logic via opening 210, wherein the etch process used to form these openings in ILD layers 110a, 110b, are selective with respect to both the etch stop layer 204 and the hardmask 122. After the definition of openings 208 and 210, a planarizing material (not shown) is then used to refill the openings so that the trenches for the upper level logic wiring may be defined. The planarizing material may be an organosilicate or any, other suitable material known those skilled in the art of dual Damascene processing.

Figure 7:
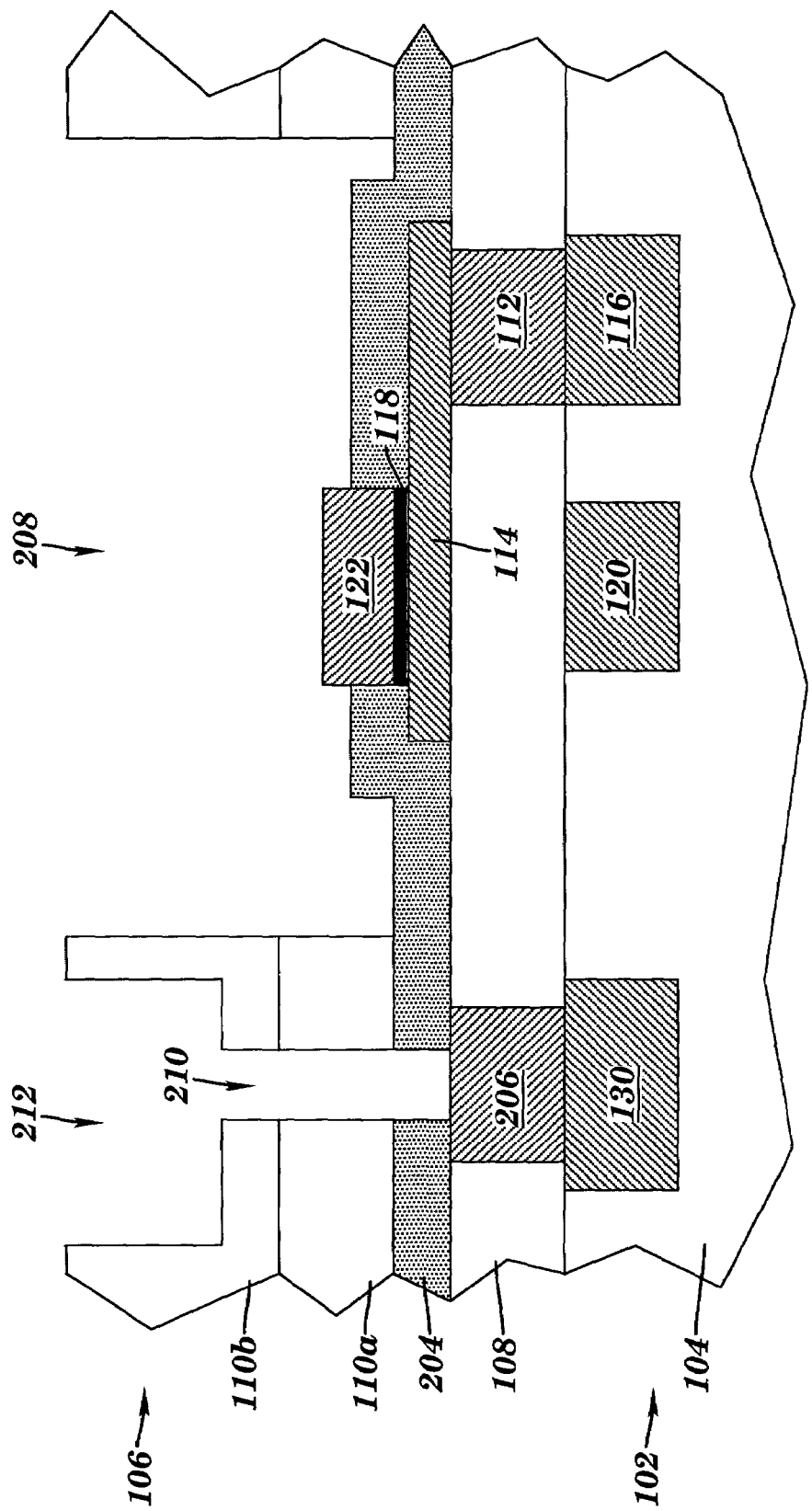

Once the planarizing fill material is added, a masking step is used prior to etching the upper level logic wiring trench 212, as shown in FIG. 7 (the bitline slot opening 208 being protected by the masking). In etching the upper level logic wiring trench 212, a standard fill-open etch is also performed with sufficient time to clean out the fill material from the bottom of the logic via 210 by the end of the trench etch. Because the bitline slot opening 208 is substantially masked from the upper level logic wiring trench etch, the planarizing fill material is not yet cleared therefrom at that point. Then, the portion of the etch stop layer 204 at the bottom of the logic via 210 is etched away so to enable electrical connection between the logic via metal and the metal landing area 206. The remaining fill in the bitline slot opening 208 is then removed by a suitable fill removal etch which does not attack the hard mask 122 or the etch stop layer 204.

Although slightly more difficult to implement due to process window issues, the use of landing areas 206 may be eliminated if the logic via etch is extended through etch stop layer 204 and then continued through dielectric layer 108 to land the logic via directly on metal pad 130. This is enabled by sufficient masking of the bitline slot opening 208 so that the etch stop layer 204 is not eroded in the vicinity of the MTJ. An advantage to this scheme is the potential for reduced logic via resistance and relaxed overlay requirements for aligning said via. Alternatively, processing is possible using bilayer resists, which can include metallic liner materials, although the planarizing approach is most compatible with methods in state-of-the-art etching.

Figure 8:
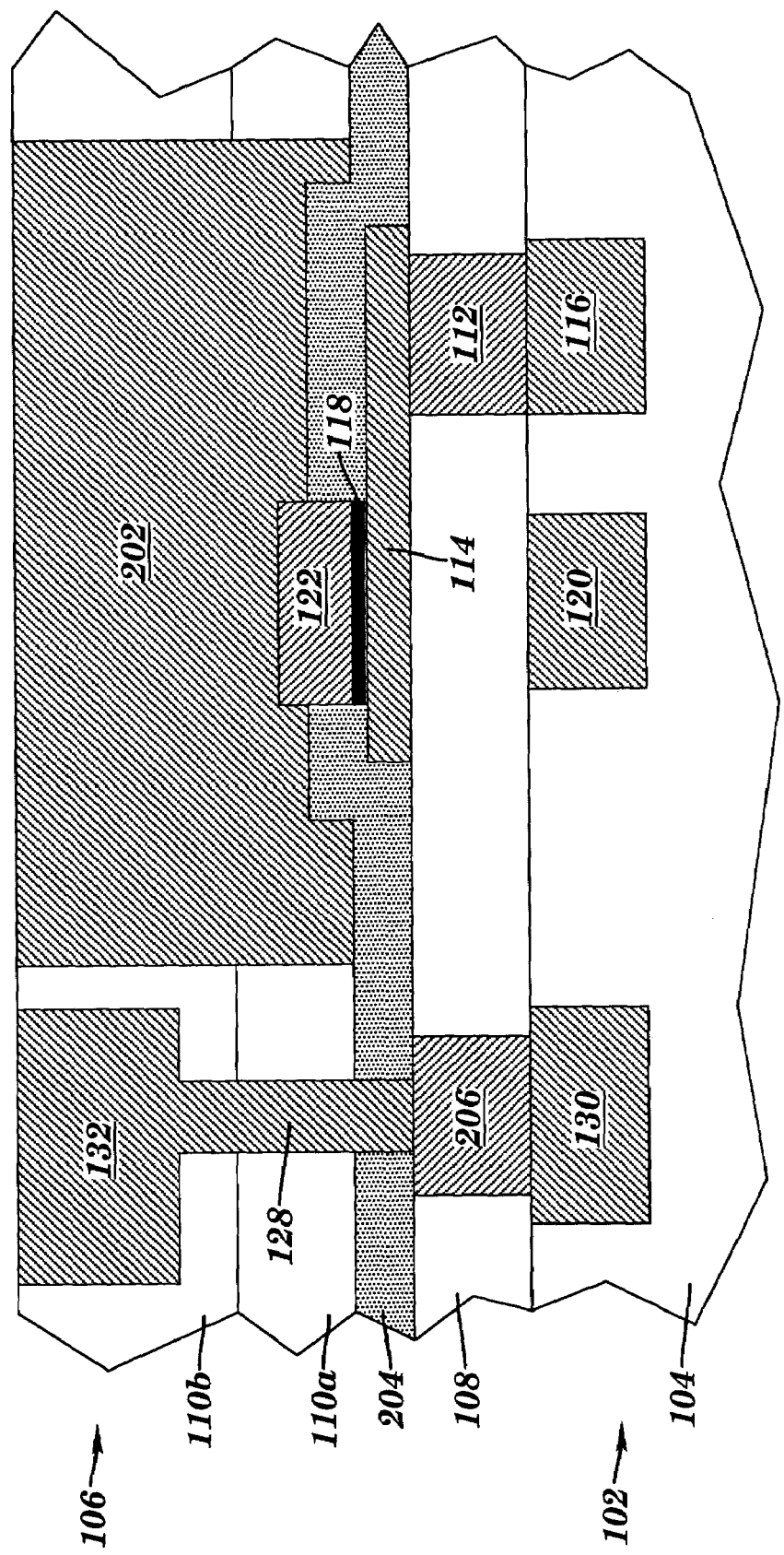

Finally, FIG. 8 illustrates the structure after a Damascene-like process has been used to simultaneously fill and polish the logic via 128, upper level conductor 132, and bitline slot 202. Although not specifically illustrated in the process flow diagrams, any connections between a bitline slot and an upper level logic conductor may be made in peripheral regions where strap vias are absent, thus avoiding the risk of shorting to layers beneath. In addition, the upper level logic wiring trench mask is designed to overlap the bitline slots in suitable peripheral areas, and to overlap the logic vias elsewhere.

Figure 9:
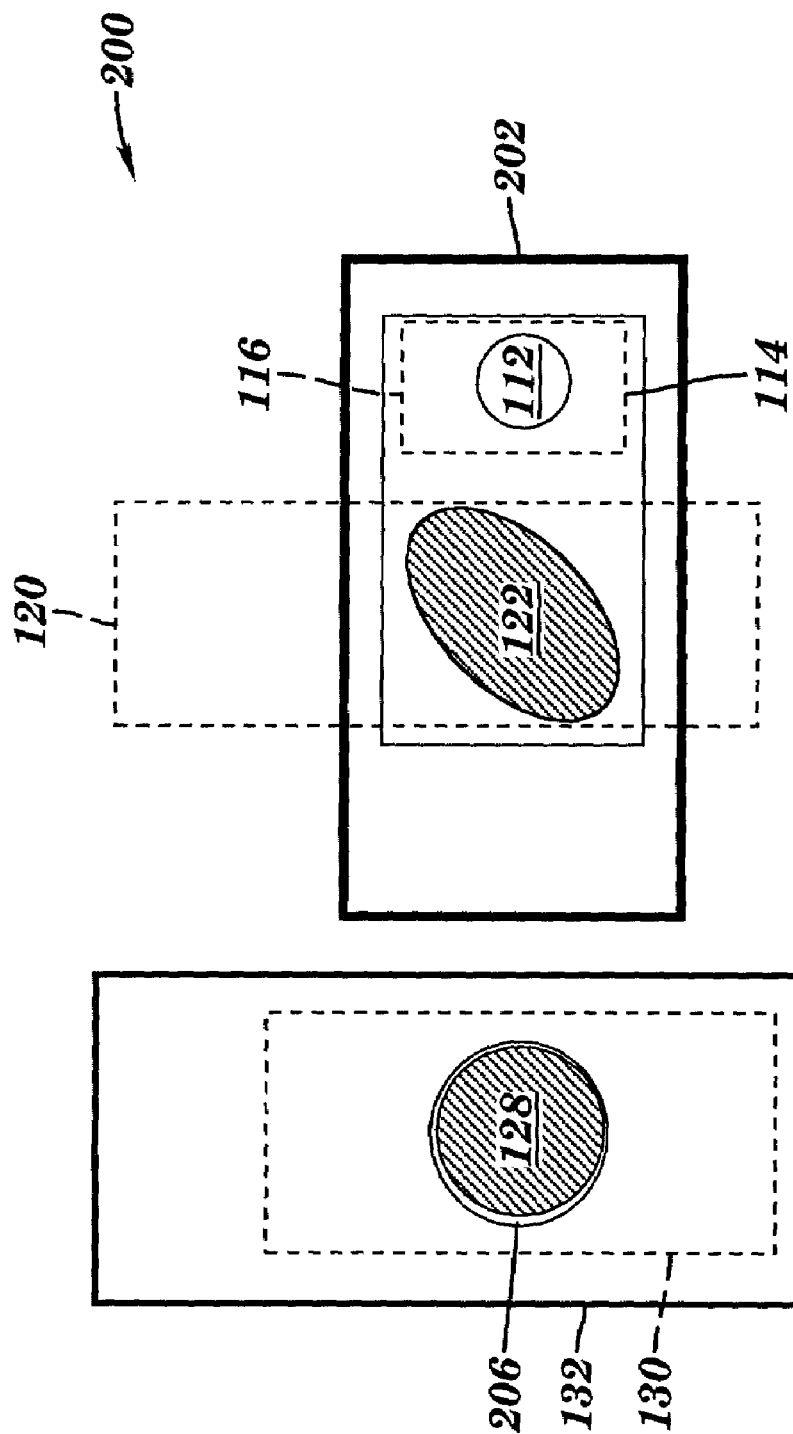
FIG. 9 is a top view of the slot via bitline MRAM device of FIG. 8.
Figure 10:
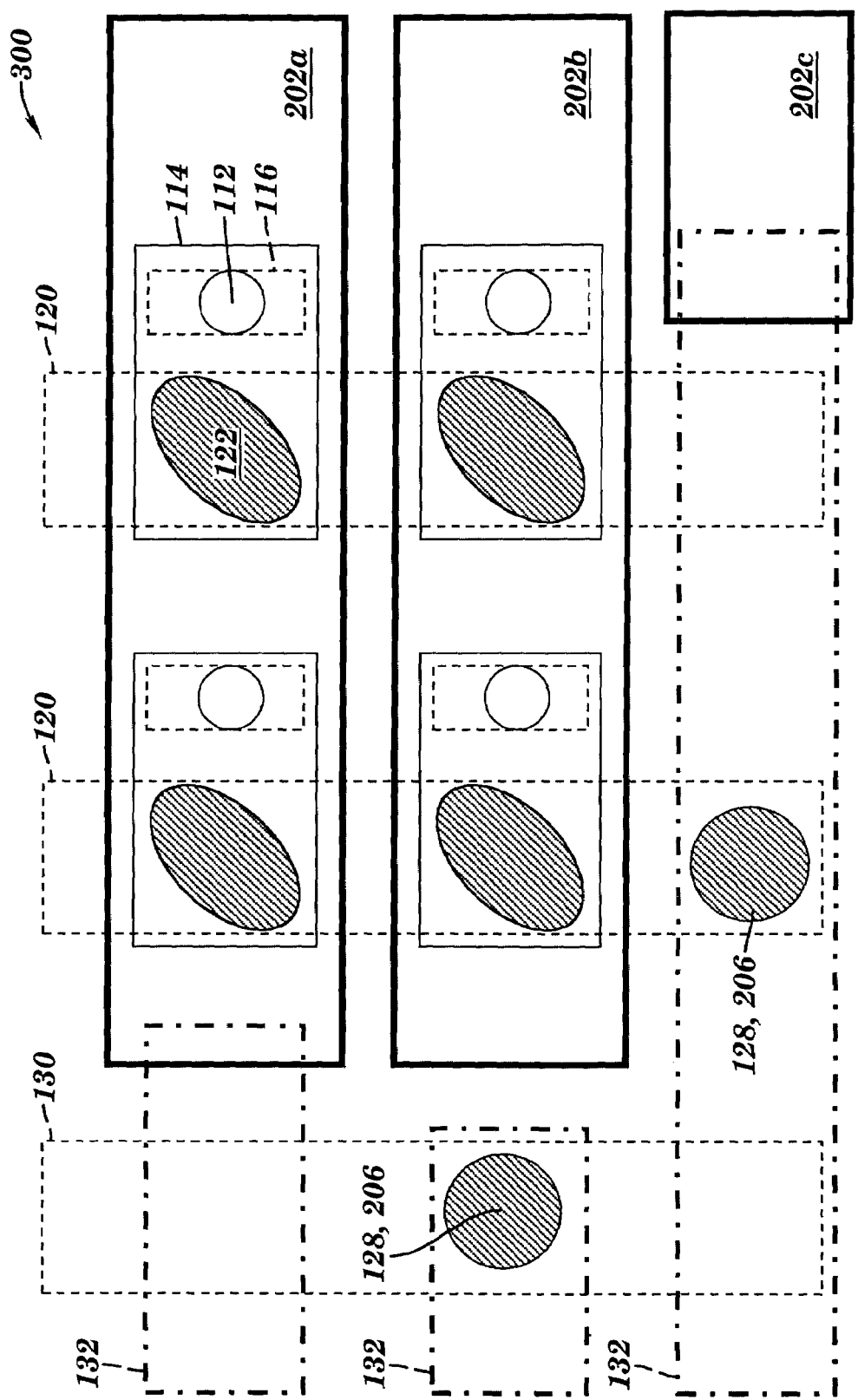
FIG. 10 is a top view of another configuration of slot via bitline MRAM device, in accordance with a further embodiment of the invention.

FIG. 9 is a top view of the MRAM device of FIG. 2 that illustrates the relationship between the upper and lower wiring levels of the logic portion of the device and the array portion of the device. Again, in this simplified example, the bitline slot 202 is not shown connected to the upper level logic conductor associated with the peripheral logic circuitry of the device 200. In contrast, FIG. 10 illustrates a further example of a simplified array 300 in which bitline slots 202a and 202b are used as the bitline conductors for individual rows of array cells. In addition to the bitline conductors, the slot configuration may also be used in any peripheral regions where high currents flow, and that have no particular need for low capacitance. For example, slot 202c is connected to one of the upper level wiring lines 132 in the periphery of the device 300, representing an area of high current therein. Except for such regions of high current, slot bitlines would not generally be used in logic circuitry as they are associated with higher capacitance, and thus non-optimized circuit speed even though they have somewhat lower resistance.

Unlike many other types of memory devices, the MTJ capacitance of an MRAM device represents the dominant device capacitance. As such, the additional capacitance associated with using a deep slot via is negligible, and there is no associated speed penalty as otherwise might be the case for logic circuitry. Accordingly, through the use of slot via bitlines in an MRAM array, lower power operation of the array is one benefit that may be realized (as less resistance in the bitlines implies a lower source voltage can be used for a given switching current and associated switching field). On the other hand, this may be traded for other advantages such as higher density, higher current, more flexibility in choice of memory element, and device simplicity by eliminating the need for ferromagnetic liners.

From a processing standpoint, although the present configuration provides a higher magnetic field for an MTJ at a given current (because the current centroid is closer to the MTJ), the integration scheme is nonetheless compatible with existing wiring techniques that share logic with embedded memory applications. The slot bitline approach also simplifies processing with respect to the MTJ hardmasks since existing hardmask via processing adds extra steps, and is subject to extremely tight lithography overlay requirements as devices scale to smaller dimensions.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A magnetic random access memory (MRAM) device, comprising:
    a magnetic tunnel junction (MTJ) stack formed over a lower wiring level;
    a conductive hardmask formed directly upon said MTJ stack; and
    an upper wiring level formed over said hardmask, said upper wiring level comprising a slot via bitline formed therein, said slot via bitline in contact with said hardmask and in contact with an etch stop layer at least partially surrounding sidewalls of said hardmask;
    wherein said slot via bitline has a bottom surface topography associated therewith such that the bottom surface of said slot via bitline is in contact with said hardmask and said etch stop layer in accordance with topographical height changes of the etch stop layer and with topographical height changes between the etch stop layer and the hardmask.

2. The MRAM device of claim 1, further comprising:
    a conductive lateral strap upon which said MTJ stack is formed; and
    a strap via connecting said strap to a first conductor within said lower wiring level.

3. The MRAM device of claim 2, wherein said etch stop layer comprises a material that is selectively etched with respect to said hardmask layer.

4. The MRAM device of claim 3, further comprising a conductive landing pad formed at the same level as said strap via, said conductive landing pad in contact with a second conductor within said lower level in a peripheral portion of the device.

5. The MRAM device of claim 4, further comprising a logic via formed on said conductive landing pad, said logic via extending through said etch stop layer.

6. The MRAM device of claim 5, further comprising an upper level logic wiring conductor in contact with said logic via.

7. The MRAM device of claim 1, wherein the slot via bitline is formed in a manner so as to land on a top surface of the etch stop layer without also penetrating through the etch stop layer.

8. The MRAM device of claim 1, wherein the slot via bitline comprises a single fill material.

* * * * *